(12) United States Patent
Oosterlaken

(10) Patent No.: US 10,319,621 B2
(45) Date of Patent: Jun. 11, 2019

(54) SEMICONDUCTOR PROCESSING ASSEMBLY AND FACILITY

(71) Applicant: ASM IP HOLDING B.V., Almere (NL)

(72) Inventor: Theodorus G. M. Oosterlaken, Almere (NL)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 14/758,690

(22) PCT Filed: Dec. 31, 2013

(86) PCT No.: PCT/NL2013/050962
§ 371 (c)(1),
(2) Date: Jun. 30, 2015

(87) PCT Pub. No.: WO2014/104895
PCT Pub. Date: Jul. 3, 2014

(65) Prior Publication Data
US 2015/0340253 A1    Nov. 26, 2015

Related U.S. Application Data

(60) Provisional application No. 61/766,735, filed on Feb. 20, 2013, provisional application No. 61/747,383, (Continued)

(51) Int. Cl.
*H01L 21/677*    (2006.01)

(52) U.S. Cl.
CPC .... *H01L 21/6773* (2013.01); *H01L 21/67733* (2013.01); *H01L 21/67736* (2013.01); *H01L 21/67769* (2013.01); *H01L 21/67778* (2013.01)

(58) Field of Classification Search
CPC ............. H01L 21/6773; H01L 21/67733
See application file for complete search history.

(56) References Cited

U.S. PATENT DOCUMENTS 5,527,390 A    6/1996 Ono et al.
6,579,052 B1 *  6/2003 Bonora ............ H01L 21/67161
                                                414/222.01
(Continued)

FOREIGN PATENT DOCUMENTS

EP    1 146 451    10/2001

*Primary Examiner* — Mark C Hageman
(74) *Attorney, Agent, or Firm* — Preti Flaherty Beliveau & Pachios LLP

(57) ABSTRACT

A semiconductor processing assembly, comprising at least one semiconductor processing system and a substrate cassette stocker with stocker positions that are at least partially disposed within a footprint of the at least one semiconductor processing system. The semiconductor processing system also includes a local substrate cassette transport system for exchanging substrate cassettes with a global cassette transport system of a processing facility. The local substrate cassette transport system transports cassettes between its substrate cassette exchange station and the stocker positions. Also disclosed is a semiconductor processing facility, having a clean room bay area and a clean room chase area, disposed adjacent to the clean room bay area and separated therefrom by a clean room bounding wall. The facility also includes a semiconductor processing assembly having at least two semiconductor processing systems and a local substrate cassette transport system for transporting substrate cassettes between the semiconductor processing systems.

17 Claims, 16 Drawing Sheets

Related U.S. Application Data filed on Dec. 31, 2012, provisional application No. 61/747,384, filed on Dec. 31, 2012.

(56) References Cited

U.S. PATENT DOCUMENTS

| | | | | |
|---|---|---|---|---|
| 6,698,991 | B1 * | 3/2004 | Bachrach | H01L 21/67196 414/217 |
| 7,308,757 | B2 * | 12/2007 | Fukuhara | H01L 21/67727 198/465.2 |
| 7,496,423 | B2 * | 2/2009 | Bachrach | G05B 19/41865 414/217 |
| 9,187,260 | B2 * | 11/2015 | Ota | B65G 37/02 |
| 2008/0240892 | A1 * | 10/2008 | Courtois | H01L 21/67769 414/225.01 |
| 2009/0003977 | A1 | 1/2009 | Aburatani | |
| 2010/0003111 | A1 | 1/2010 | Yeo et al. | |
| 2011/0110752 | A1 * | 5/2011 | Tauchi | H01L 21/67184 414/217 |
| 2011/0222994 | A1 | 9/2011 | Inagaki et al. | |

* cited by examiner

SEMICONDUCTOR PROCESSING ASSEMBLY AND FACILITY

FIELD OF THE INVENTION

The present invention relates to the field of semiconductor processing equipment. More in particular to a semiconductor processing assembly including a semiconductor processing system, a substrate cassette stocker, and a local substrate cassette transport system. Additionally, the invention also relates more particular to a semiconductor processing system architecture that facilitates an efficient use of available clean room space.

BACKGROUND

A semiconductor processing assembly may typically comprise a substrate cassette exchange station for exchanging substrate cassettes with a fab substrate cassette transport system, such as an Over Head Transport system. In this respect, it is desirable that a semiconductor processing assembly comprises a substrate cassette stocker for stocking one or more cassettes. This provides greater flexibility in a cassette logistics.

For instance, in a semiconductor processing assembly including a batch semiconductor processing system, wherein a batch comprises wafers from a plurality of substrate cassettes, it is convenient if all substrate cassettes involved can be stored at the system. After loading the batch of wafers from the substrate cassettes into the semiconductor processing system, the empty substrate cassettes can then stay with the system during processing. After completion of the treatment, the cassettes may readily be filled with processed wafers, without a need to transport the cassettes in the intermediate time.

Typically, a substrate cassette stocker is positioned at the front of a semiconductor processing assembly, in a clean room bay area of the processing facility. With growing wafer size, and in particular with 450 mm wafer size, such front-side substrate cassette stockers require a lot of precious space. This is because they need not only provide for space for the stocker positions/substrate cassette accommodations, but also for maneuvering of the substrate cassettes.

Efficient use of clean room floor space is important in semiconductor processing facilities. Typically a processing system is disposed in a clean room chase area or service area, with a front face flush with a bounding wall of a clean room bay area. The processing system may include a substrate cassette exchange station, arranged at the front of the processing system, and configured to receive substrate cassettes, containing substrates to be processed, from the clean room bay area.

In addition to a small foot print in the chase area, a small face print with the clean room bay area wall is desirable. Typically the chase area and the bay area have similar clean room classifications. Often, in the chase area space is available that cannot be utilized because no clean room wall is available to place additional systems. Generally, the length or depth of a processing system, i.e. the dimension of the processing system perpendicular to the clean room wall, may vary between different systems and the chase area may be dimensioned to accommodate processing systems with a certain maximum depth. When only systems with a smaller depth, e.g. a small or medium depth, are used, a significant part of the chase area is necessarily left unused.

EP 1 146 451 A2 discloses a fabrication system and a method of promoting fault tolerant production capacity for semi-conductor processing equipment. The fabrication system includes a transport aisle or bay area that is bounded by a clean room wall and a clean room or chase area in which a plurality of semiconductor processing tools are positioned. Additionally, within the clean room a storage apparatus is accommodated that extend perpendicular to the transport aisle and that has one or more load ports adapted to receive a wafer carrier from a factory transport agent (e.g., an overhead conveyor, an automatic guided vehicle, FAB personnel, etc.). Each processing tool has one or mor tool loading platforms coupled thereto, such that one or more wafer carriers may be transferred from the tool loading platform to the respective processing tool. The storage apparatus is a separate unit from the processing tools and may comprise a vertical transfer mechanism (such as an elevator or pick and place robot) and a horizontal transfer mechanism (such as a conveyor or a shelf coupled to a pick and place robot). The storage apparatus may comprise a conveyor adapted to transfer a wafer carrier between processing tools within the clean room.

SUMMARY OF THE INVENTION

It is an object of the present invention to provide a solution for the utilization of unused chase area space.

Accordingly, the present disclosure is directed to a semiconductor processing facility according to claim 1. The semiconductor processing facility may comprise a clean room bay area that is at least partially bounded by a clean room bounding wall, and a clean room chase area that is disposed adjacent to the clean room and separated therefrom by the clean room bounding wall. The semiconductor processing facility may accommodate a semiconductor processing assembly. The assembly may include at least one first semiconductor processing system having a front side, said system extending through the clean room bounding wall, such that its front side is generally flush therewith and accessible from the clean room bay area. The assembly may further include at least one second semiconductor processing system, disposed completely within the clean room chase area and spaced apart from the clean room bounding wall. The assembly may also include a local substrate cassette transport system, configured to transport substrate cassettes between the at least one first and at least one second semiconductor processing systems.

The assembly may include at least one first semiconductor processing system having a front side and a back side; at least one second semiconductor processing system, disposed at the back side of the at least one semiconductor processing system, optionally spaced apart therefrom; and a local substrate cassette transport system including a substrate cassette exchange station for exchanging substrate cassettes with a global cassette transport system of a processing facility, wherein said substrate cassette exchange station is provided at the front side of the at least one first semiconductor processing system, and wherein said local substrate cassette transport system is configured to transport substrate cassettes between its substrate cassette exchange station and the at least one first and at least one second semiconductor processing systems.

The at least one first and at least one second processing system of the assembly may both be associated with a respective, horizontally extending longitudinal axis. The at least one first and at least one second semiconductor processing systems may then be arranged such that their respective longitudinal axes extend in parallel, and preferably in alignment. It is understood that in case a semiconductor processing assembly includes multiple juxtaposed first semiconductor processing systems, the longitudinal axes of each of the first processing systems may run in parallel with the longitudinal axis associated with the at least one first semiconductor processing system. (i.e. the aggregate of first semiconductor processing systems). Similarly, in case a semiconductor processing assembly includes multiple juxtaposed second semiconductor processing systems, the longitudinal axes of each of the second processing systems may run in parallel with the longitudinal axis associated with the at least one second semiconductor processing system (i.e. the aggregate of second first semiconductor processing systems). The longitudinal axis of the at least one first semiconductor processing system may typically extend perpendicular to the clean room bounding wall through which the system extends.

The at least one first and/or second semiconductor processing system may include a plurality of juxtaposed first and/or second semiconductor processing systems, respectively.

In general, a processing system may comprise a housing. The housing may typically have a generally angular, e.g. rectangular, footprint, and define a front face, a back face, and at least one side face. In the present context, the front face of a processing system's housing may be construed to refer to a face facing towards the front of the semiconductor processing assembly, while the back face may be construed to refer to a face facing away from the front of the semiconductor processing assembly. The at least one side face may define a part of a longitudinal side of the assembly. In embodiments of the semiconductor processing assembly including a plurality of semiconductor processing systems, each two longitudinally adjacent systems may be arranged such that a front face of one system faces a back face of the other system. To save space, the front and back faces may be in contact with each other. Alternatively, for instance to facilitate maintenance, the front and back faces may be spaced apart.

The local substrate cassette transport system may include a rail system which in itself may be of a conventional design. The rail system may include one or more rails, associated drivable substrate cassette carriages for transporting substrate cassettes along the rails, hoist provisions and/or other features as may be needed. In one embodiment, the local substrate cassette transport system may comprise at least one linear, substantially horizontally and longitudinally extending transport rail along which a substrate cassette is transportable, typically by means of a drivable substrate cassette carriage. The transport rail may be disposed along a longitudinal side of the processing assembly, and extend between, on the one hand, the substrate cassette exchange station at the front of the assembly, and, on the other hand, the substrate cassette I/O-stations of the processing systems of the assembly disposed at that longitudinal side.

The present disclosure is related to the following patent applications co-assigned herewith and which are incorporated herein by reference for further optional details on various aspects of the semiconductor processing assembly: US provisional Patent Applications 61/732,477, filed 3 Dec. 2012, 61/747,383 and 61/747,384, both filed on 31 Dec. 2012, and 61/766,735, filed on 20 Feb. 2013.

These and other features and advantages of the invention will be more fully understood from the following detailed description of certain embodiments of the invention, taken together with the accompanying drawings, which are meant to illustrate and not to limit the invention.

DETAILED DESCRIPTION

Figure 1:
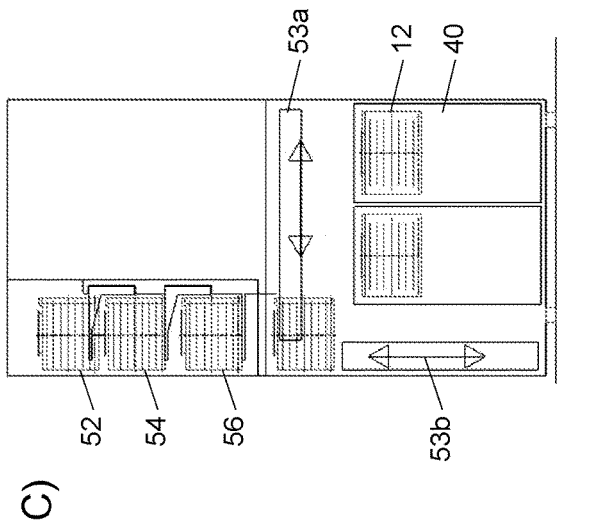
FIG. 1 schematically illustrates a first example of a semiconductor processing assembly in, respectively, a top plan view (FIG. 1A), a side view (FIG. 1B), and a rear view (FIG. 1C)
Figure 1:
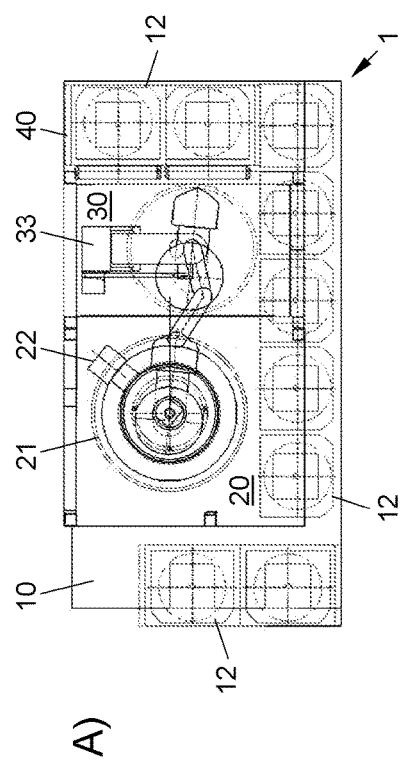
Figure 1:
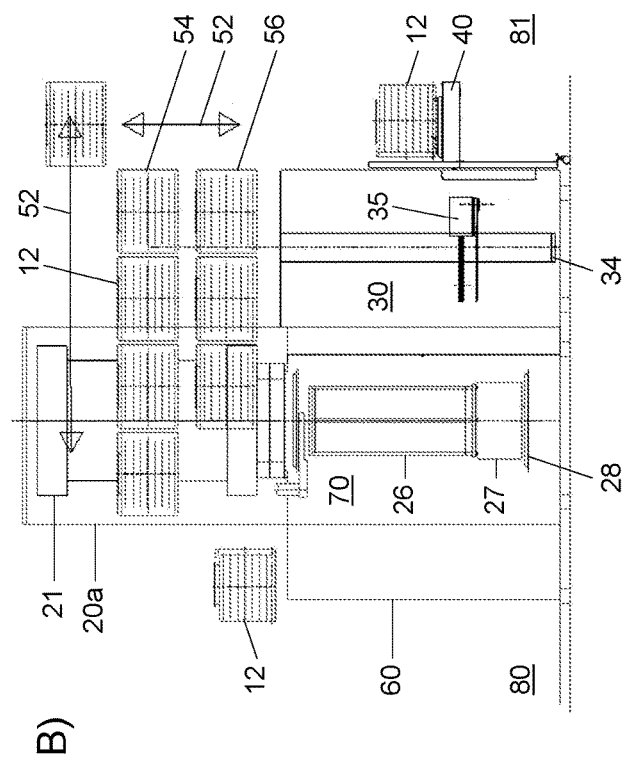

Below the invention is explained in general terms, and where appropriate with reference to the Figures, in which similar parts are indicated by same reference numerals.

FIGS. 1A-C schematically illustrate a semiconductor processing assembly comprising a single semiconductor processing system 1 configured to subject one or more semiconductor substrates or wafers to a physical and/or chemical treatment. In the depicted embodiment, the semiconductor processing system is a vertical furnace.

The semiconductor processing system 1 may comprise a gas supply module 60, a processing module 20 having a housing 20a, a wafer handling module 30 having a housing 30a and a substrate cassette I/O-station module 40. Such a semiconductor processing system is described in more detail in U.S. Provisional Patent Application No. 61/732,477, co-assigned herewith, and incorporated herein by reference in its entirety.

The processing module 20 may comprise a vertical furnace 21 in an upper region thereof. A housing 20a may be provided around the vertical furnace 21. A boat elevator 22 may move a wafer boat 26 holding a plurality of wafers into the vertical furnace 21 from the space below and vice versa. The boat may be supported on a pedestal 27 and a door plate 28. A mini-environment 70 may be provided in the space below the furnace. Typically, the mini-environment 70 may comprise a particle filter and a blower for circulating filtered air or nitrogen ($N_2$), and cooling means for removing heat released after unloading of a hot wafer boat.

The wafer handling module 30 may comprise a wafer handling robot 33 with an axis 34 for vertical movement and a multi axis arm 35 for gripping wafers. Furthermore, wafer handling module 30 may comprise a particle filter and a blower both not shown, for circulating clean filtered air or nitrogen ($N_2$) in the wafer handling space.

The gas cabinet 60 may accommodate all primary electrical components and process gas facilities, including for example pressure gauges, flow controllers, valves, a process gas controller, and peripheral equipment of the vertical furnace semiconductor processing system 1, and distribute gas and electrical facilities to the processing module 20, the wafer handling module 30, and the I/O-station module 40.

In a processing facility, the semiconductor processing system 1 may be placed such that the gas supply module 60 faces a clean room bay area 80 while the substrate cassette I/O-station module 40 is facing the clean room service area or chase area 81. Typically the clean room classification of the bay area 80 and the chase area 81 may be similar; in the case of differences, the cleanliness of the chase area may normally be somewhat less than that of the clean room bay area 80.

The substrate cassettes 12 may typically comprise a door which is closed during transport to protect the wafers inside against contamination. The substrate cassette I/O-station 40 may include at least one load port to which a substrate cassette 12 is dockable; this load port may include a door opener configured to open or remove the door of/from the cassettes 12 docked to the load port, in order to bring the cassette into communication with the wafer handling robot 33 of the wafer handling module 30.

The semiconductor processing assembly may further comprise a local substrate cassette transport system 52.

The local substrate cassette transport system may include a substrate cassette exchange station 10, e.g. in the form of a (railed) platform, for exchanging substrate cassettes 12 with a global or fab substrate cassette transport system. The substrate cassette exchange station 10 may typically be provided at a front side of the at least one semiconductor processing system of the assembly, and, preferably, within a footprint of the system. In one embodiment, such as the embodiment depicted in FIGS. 1A-C, the substrate cassette exchange station 10 and the substrate cassette I/O-station 40 may be spaced apart, such that they are disposed at preferably longitudinally opposite sides of the semiconductor processing system 1; that is, the substrate cassette exchange station 10 may be disposed at the front of the system 1, while the substrate cassette I/O-station 40 may be disposed at the back thereof. In another embodiment, the substrate cassette exchange station 10 and the substrate cassette I/O-station 40 may be functionally and structurally integrated, and thus be disposed at a same side of the semiconductor processing system 1, e.g. at the front side.

The local substrate cassette transport system may be configured to transport substrate cassettes 12 between its substrate cassette exchange station 10, at least one stocker position of a substrate cassette stocker (to be discussed infra), and/or the substrate-cassette I/O-station 40 of the at least one semiconductor processing system 1. To this end the local substrate cassette transport system may include a rail system which in itself may be of a conventional design. The rail system may include one or more rails, associated drivable substrate cassette carriages for moving substrate cassettes along the rails, hoist provisions and/or other features as may be needed. The rails may preferably be at least partially, and preferably completely, disposed within a footprint of the at least one semiconductor processing system of a semiconductor processing assembly.

The local substrate cassette transport system 52 may include a rail system including at least one typically substantially horizontally extending main rail along which a substrate cassette 12 may be transported, typically by means of a drivable substrate cassette carriage. The at least one main rail may extend above the substrate cassette stocker, and typically in a longitudinal direction of the semiconductor processing system 1, from the cassette exchange station 10 to an opposing side of the semiconductor processing system 1, and, more specifically, to the substrate cassette I/O-station 40 in case this is provided at the opposing side of the system 1. In doing so, the main rail may extend along the substrate cassette stocker. Where desired, the local substrate cassette transport system 52 may further include an auxiliary or sub-transport system 53a configured to transport substrate cassettes 12 laterally along a laterally extending auxiliary rail, e.g. from/to one of the load ports of the I/O-station 40, and/or a sub-transport system 53b configured to transport cassettes along a vertically extending auxiliary rail in a vertical direction.

Adjacent to (the rails of) the local cassette transport system 52, a substrate cassette stocker defining at least one stocker position or substrate cassette accommodation for storing a substrate cassette 12 may be provided. The at least one stocker position may be at least partially, and preferably completely, disposed within a footprint of the at least one semiconductor processing system of the assembly. In a preferred embodiment, the substrate cassette stocker may provide for a plurality of stocker positions, e.g. two, three or more stocker positions. The plurality of stocker positions may be disposed along the rails of the local cassette transport system 52, and be juxtaposed/arranged in one or more substantially horizontally extending rows, which rows may extend in a direction from the substrate cassette exchange station 10 to an opposing side of the system, e.g. in a direction from the substrate cassette exchange station 10 to the substrate cassette I/O-station 40.

The (main rail of the) local transport system 52 may be provided at a first upper level. At a second, lower level a first row of stocker positions 54 may be provided to store substrate cassettes 12. The vertical distance between the first and the second level may be more than the substrate cassette height. At a third level, below the second level, a second row of stocker positions may be provided. The vertical distance between the second and the third level may be more than the substrate cassette height.

The positions on the third level may be accessible only when the overhead position at the second level is empty. In such a case, the substrate cassette accommodations on the second level may be made moveable, e.g. moveable to the right side so that when all positions on the second level are loaded with cassettes, and a third level position 56 needs to be accessed for loading/unloading, the substrate cassette above this position and all cassettes to the right side of it at the second level may be moved to the right so that the right most cassette is temporarily positioned above I/O-station 40 and no cassette is positioned above the third level position 54 to be accessed. After accessing the substrate cassette at the third level, the cassettes at the second level stocker can return to the positions shown in FIG. 1B.

Figure 2:
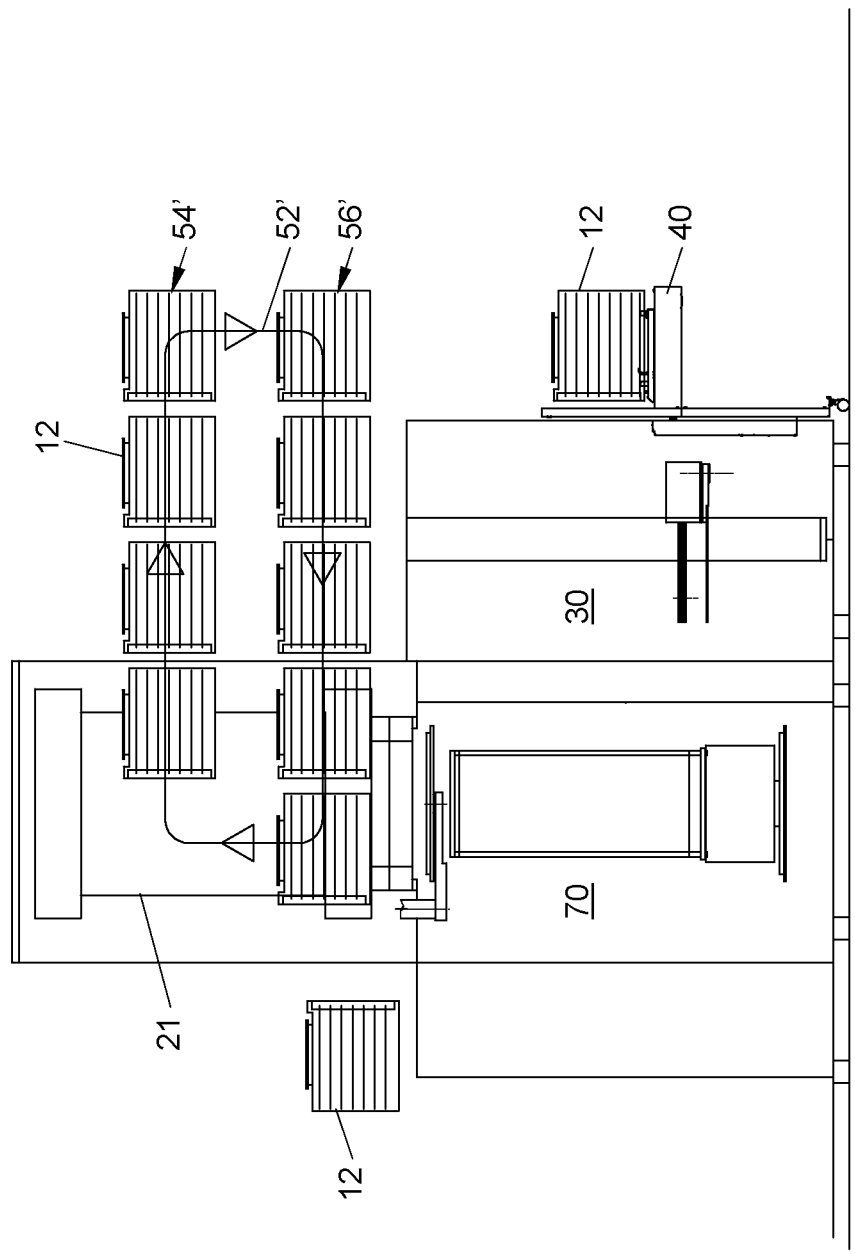
FIG. 2 schematically illustrates, in a side view, a second example of a semiconductor processing assembly.

FIG. 2 schematically illustrates a semiconductor processing assembly featuring an alternative substrate cassette stocker and local substrate cassette transport system, which are partly integrated. In this assembly the local substrate cassette transport system includes a paternoster system 52', capable of moving substrate cassettes in a sequential order in a closed loop. Accordingly, this system combines the transport function with a stocker function. At a first level 54' the cassettes are moved in a first direction and at a second level the cassettes are moved in an opposite direction. Not all positions in the paternoster system 52' need to be occupied. In an alternative embodiment, the paternoster loop may extend in a horizontal plane.

Figure 3:
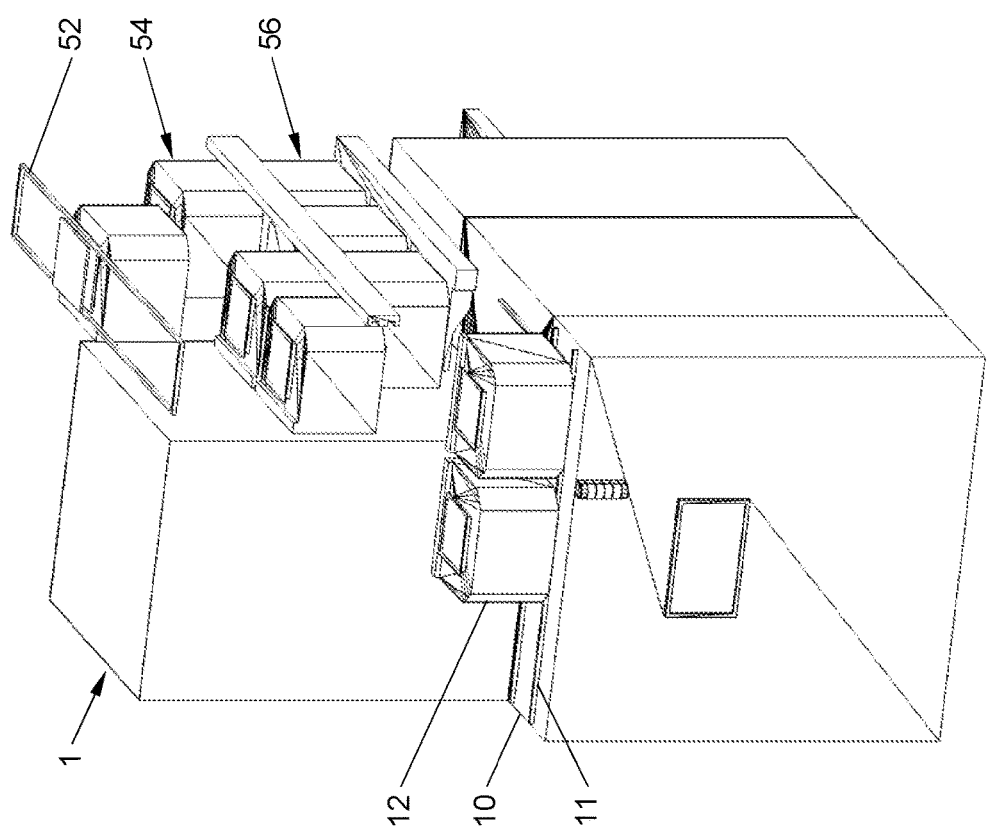
FIG. 3 schematically illustrates, in a perspective view, a third example of a semiconductor processing.
Figure 4:
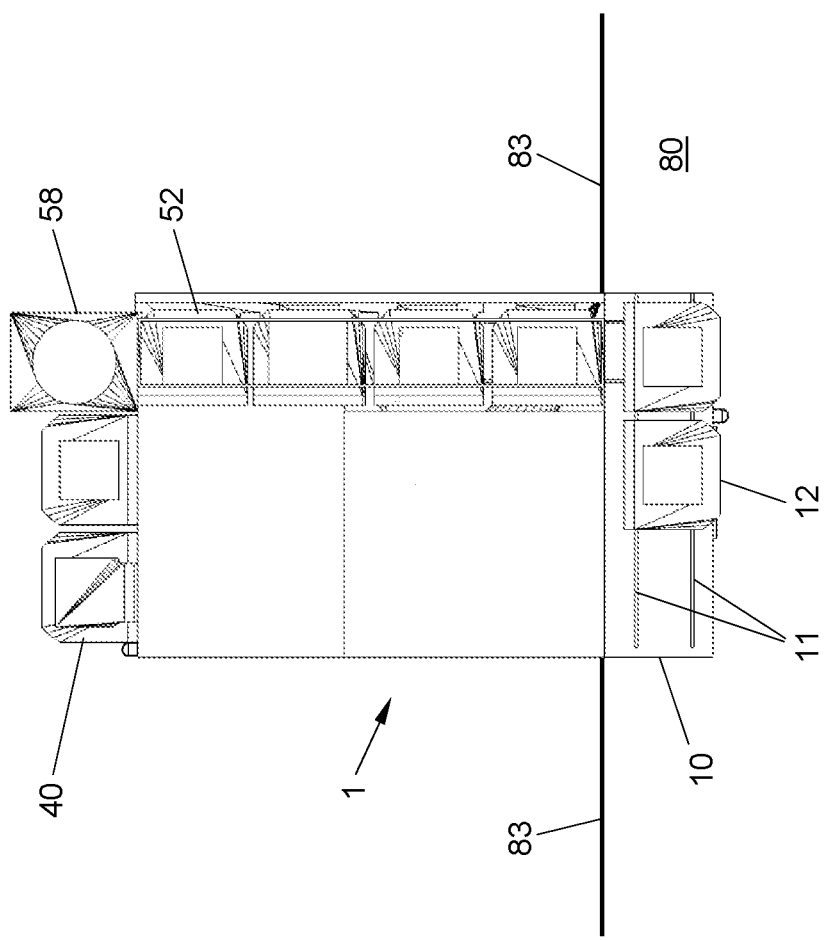
FIG. 4 schematically illustrates, in a top plan view, the semiconductor processing assembly of FIG. 3.

FIGS. 3 and 4 schematically show a semiconductor processing assembly similar to the assembly of FIGS. 1A-C. The front side of its semiconductor processing system 1 may be placed generally flush with a clean room wall 83, and face a clean room bay area 80. Substrate cassette exchange station 10 may be disposed at the front side of the system 1, and interface with a global or fab cassette transport system. As in the depicted embodiment, the cassette exchange station 10 may be provided with a laterally extending transport rail 11—which may be regarded to form a part of the local substrate cassette transport system—for lateral transport of substrate cassettes 12. The local (overhead) substrate cassette transport system 52 may take care of the transport of the substrate cassettes 12 from the front side to a back side of the system 1 at a first, upper level. The substrate cassette stocker may provide for stocker positions 54 at a second, lower level, and for additional stocker positions at a third, lowest level. A hand-off position 58 may be used to transfer a substrate cassette 12 from the local cassette transport system 52 to the substrate cassette I/O-station 40 at the back of the system 1.

Figure 5:
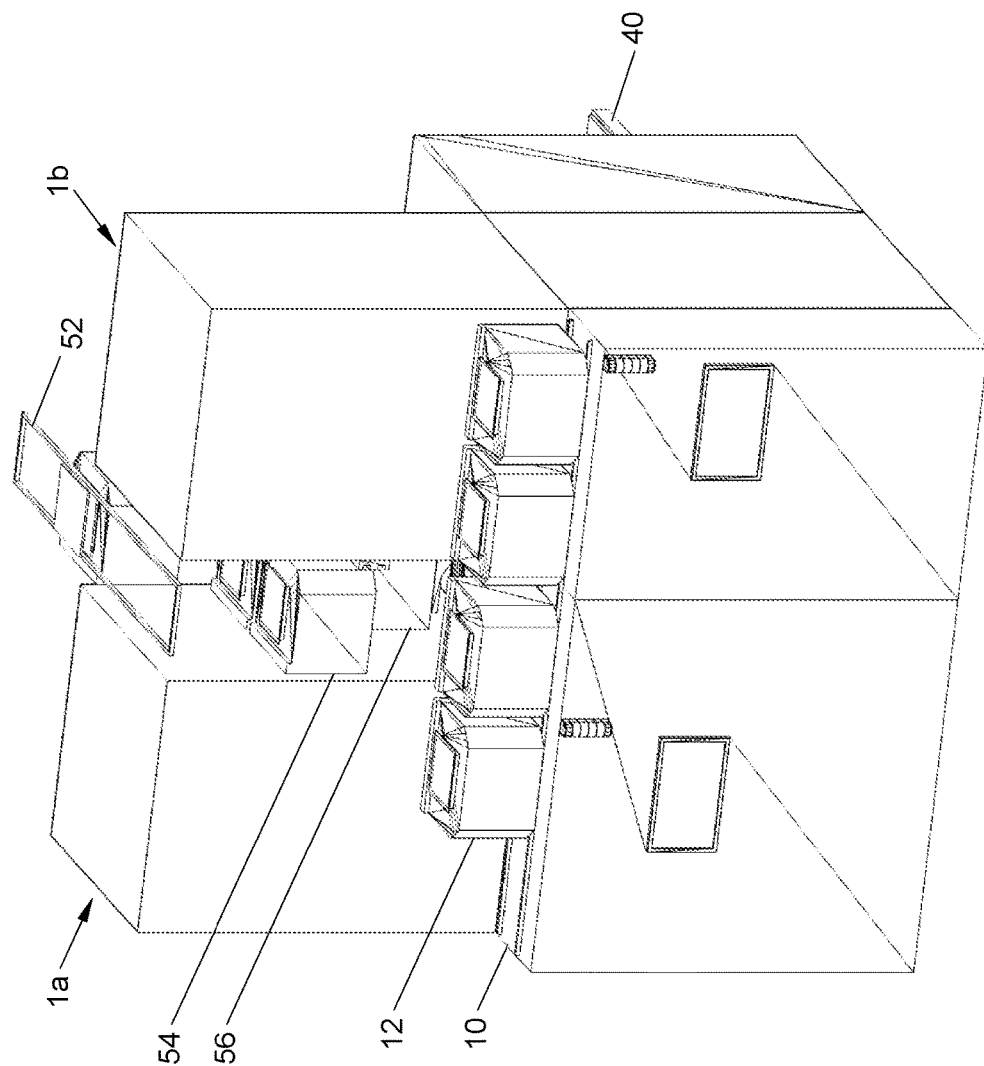
FIG. 5 schematically illustrates, in a perspective view, a fourth example of a semiconductor processing assembly, including two semiconductor processing systems sharing both a substrate cassette stocker and a local substrate cassette transport system.
Figure 6:
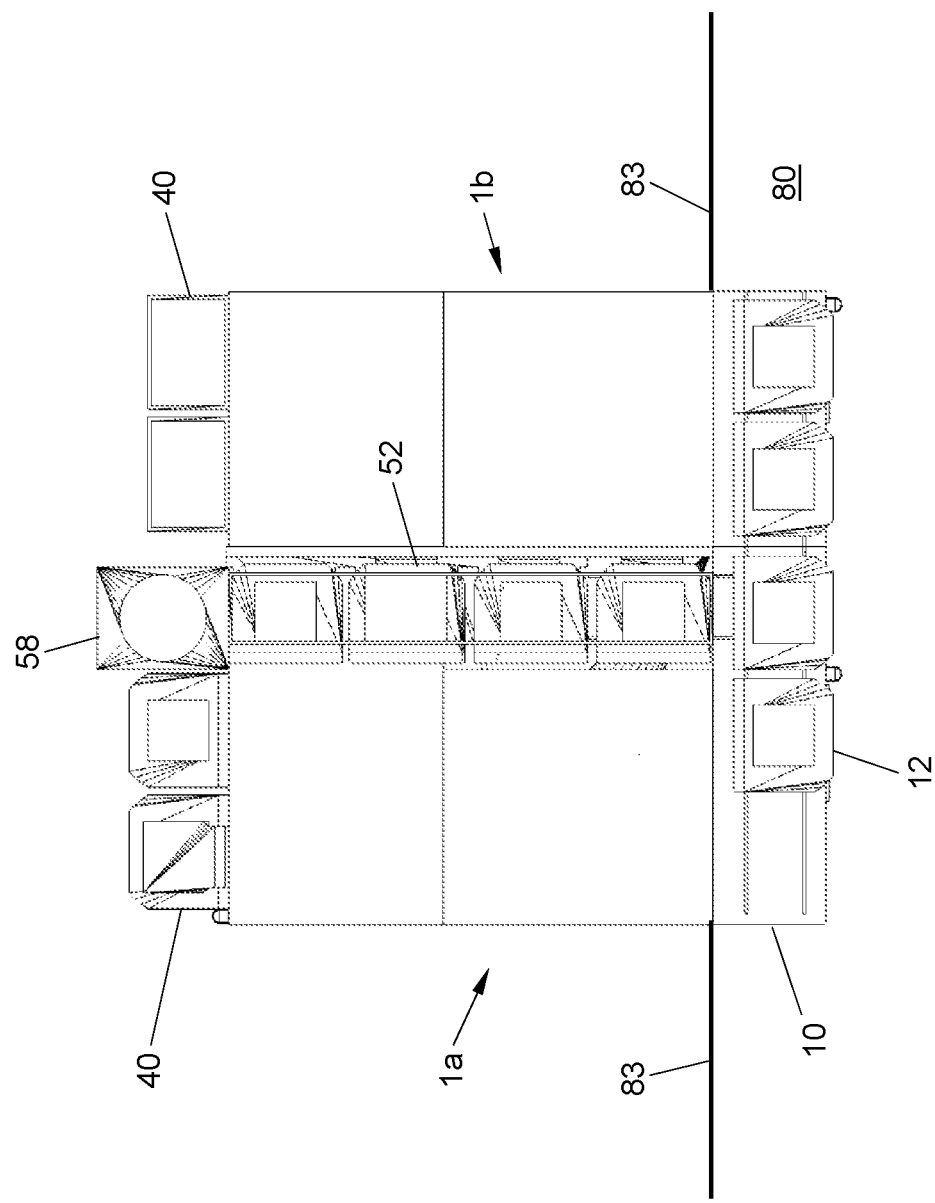
FIG. 6 schematically illustrates, in a top plan view, the semiconductor processing assembly of FIG. 5.

FIGS. 5 and 6 schematically show a semiconductor processing assembly including two semiconductor processing systems 1a and 1b, which systems 1a, 1b are placed side by side. The two systems 1a, 1b share a substrate cassette exchange station 10, a local substrate cassette transport system 52, and a substrate cassette stocker with stocker positions 54, which further reduces the overall footprint of the assembly. It is noted that both semiconductor processing systems 1a, 1b of the semiconductor processing assembly include a substrate cassette I/O-station 40, and that the shared local substrate cassette transport system 52 is configured to transport substrate cassettes 12 between the substrate cassette exchange station 10, the at least one stocker position 54, 56 of the substrate cassette stocker, and each of the substrate cassette I/O-stations 40 of the semiconductor processing systems 1 without passing the substrate cassettes 12 to a global substrate cassette transport system of a semiconductor processing facility.

Figure 7:
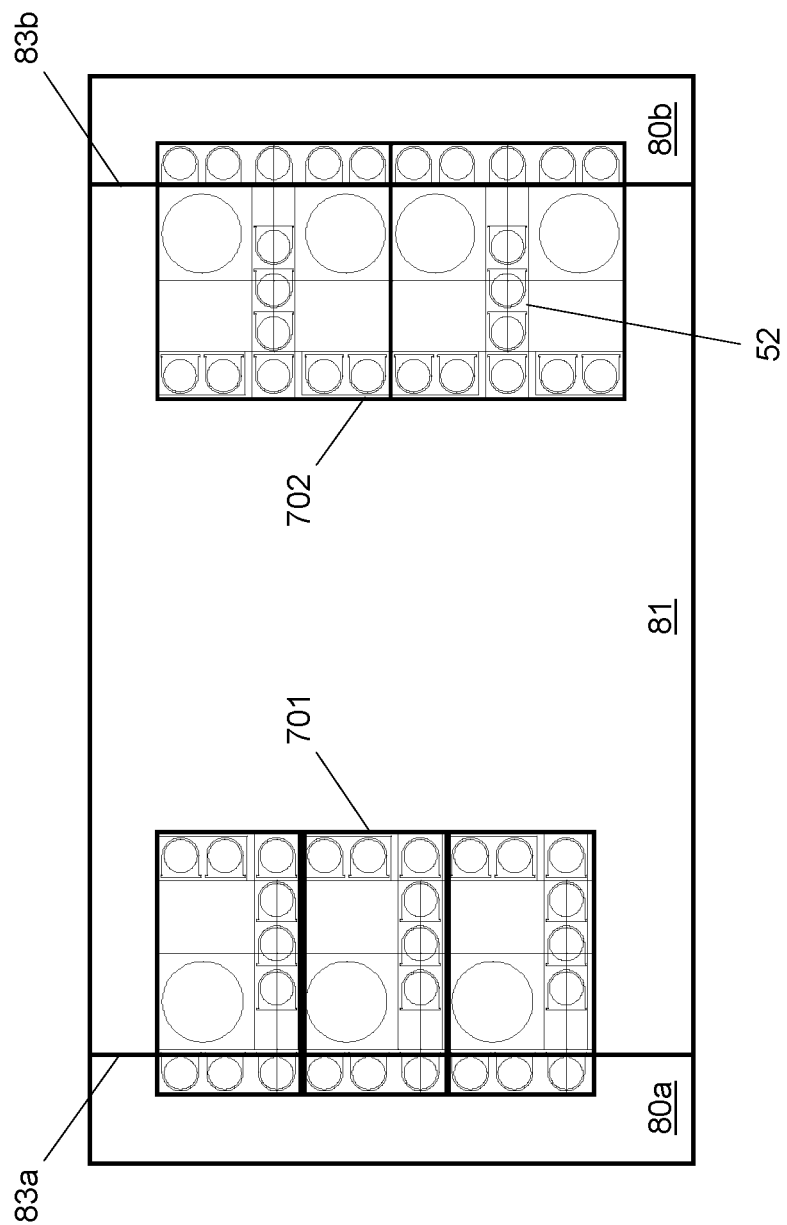
FIG. 7 schematically illustrates a floor lay-out of a clean room of a processing facility accommodating, on the left, three juxtaposed processing assemblies according to FIGS. 3-4, and, on the right, two juxtaposed processing assemblies according to FIGS. 5-6.

FIG. 7 schematically shows a top plan view of a semiconductor processing facility, accommodating, on the left, a complex 701 of three juxtaposed processing assemblies according to FIGS. 3-4, and, on the right, a complex 702 of two juxtaposed processing assemblies according to FIGS. 5-6. Within each complex 701, 702, the semiconductor processing systems 1 of different assemblies may be arranged side by side. The processing systems 1 of the assemblies may be largely disposed in a clean room chase area 81 of the facility, while the substrate cassette exchange stations 10 provided at the front sides of the systems 1/assemblies may be disposed in an actual clean room bay area 80. The gain in footprint as a result of coupling/sharing the substrate cassette stocker and the local cassette transport system in assemblies on the right (relative to the assemblies on the left) is evident from FIG. 7.

In general, it will be clear that additional stocker positions may be realized in the space above the wafer handling module 30, aside of the local cassette transport system 52. Alternatively, storage locations may be provided in the space of the service area or chase area 81 behind the semiconductor processing assemblies, preferably above the ergonomic minimum height (Semi S8; 1980 mm) and/or above the I/O-station module 40. In the latter case the local cassette transport system should extend beyond the semiconductor processing assembly so that it can serve every stocker position.

Optionally, the stocker may be provided with a purge facility for purging cassettes with an inert gas such as nitrogen. The purge facility may be provided at a position where the cassettes are received in the system, or alternatively one or more stocker positions may be provided with a cassette purge provision.

In the illustrated assemblies and facilities, there is a need to transport cassettes from/to a clean room bay area facing side of the semiconductor processing assembly to/from an opposing side of the semiconductor processing assembly where the door openers are provided and where a wafer handler robot can access the wafers in the cassettes. However, also semiconductor processing assemblies that have a regular orientation, with a cassette I/O-station having door openers at the clean room bay area facing side, may benefit of the cassette transport system and stocker positions of the present invention. Such a system may beneficially be provided with a local cassette transport system that transports cassettes from a cassette receiving side of the system in the direction of an opposing side of the system. Stocker positions may be provided adjacent to the local cassette transport system. The foot print of the local cassette transport system and the stocker positions may overlap at least partly with a foot print of the semiconductor processing system (i.e. the assembly without the local cassette transport system and stocker positions). E.g. such local cassette transport system and such stocker positions may be provided in the space above the wafer handling module and/or above the processing module. In case of a vertical furnace, which has a large height, the stocker positions can be provided above a lower part and aside of an upper part of the processing module. In such a system, having a regular orientation, the local cassette transport system may have no other function than accessing the cassette stocker positions and transporting cassettes between a substrate cassette exchange station and/or the substrate cassette I/O-station and/or the cassette stocker positions.

Although in the Figures the invention has been illustrated with reference to a semiconductor processing assembly comprising at least one vertical (batch) furnace system, different embodiments of the presently disclosed assembly may include, either instead of or in addition to the vertical (batch) furnace systems, semiconductor processing systems of a different type, e.g. other batch systems, single wafer systems, etching systems, film deposition systems, rapid thermal semiconductor processing systems, cluster systems, photo resist semiconductor processing systems, lithography systems, ion implantation systems etc.

FIGS. 8-12 relate to exemplary embodiments according to the invention.

Figure 8:
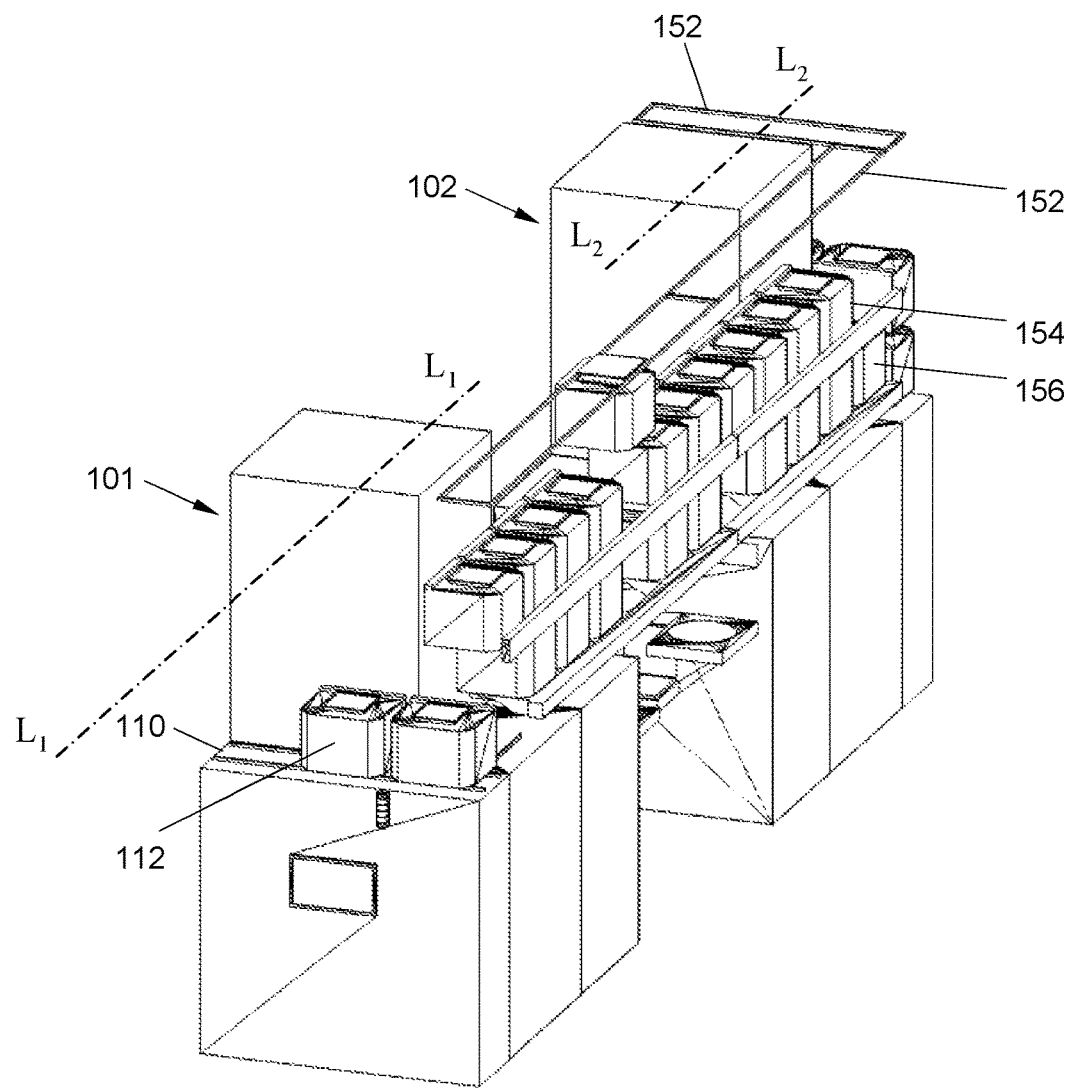
FIG. 8 schematically illustrates, in a perspective view, a fifth example of a semiconductor processing assembly comprising a first and a second semiconductor processing system that are connected in tandem by a local substrate cassette transport system.
Figure 9:
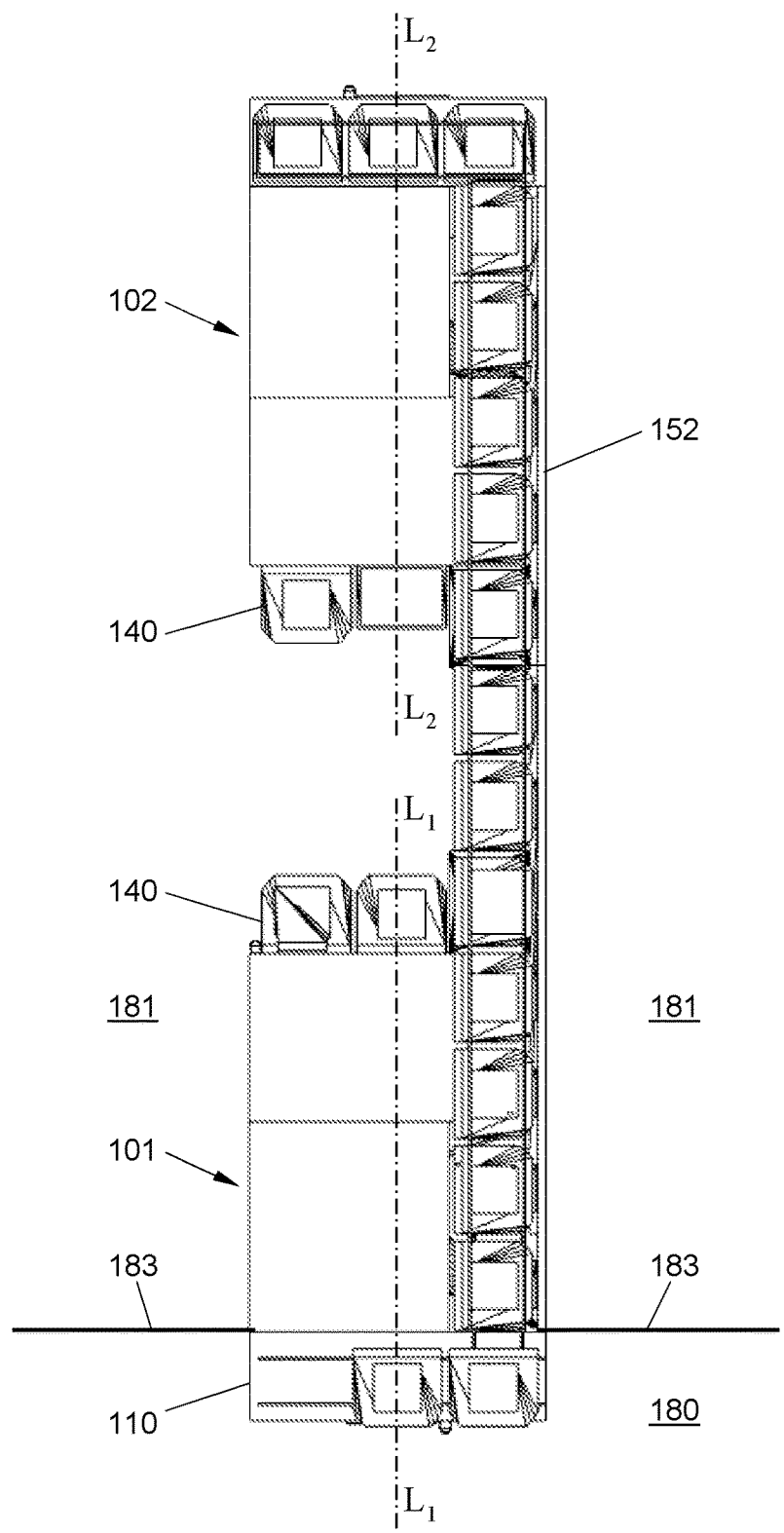
FIG. 9 is a schematic top plan view of an embodiment of semiconductor processing facility accommodating the semiconductor processing assembly of FIG. 8.

FIG. 8 schematically illustrates, in a perspective view, an exemplary embodiment of a semiconductor processing assembly. The exemplary embodiment comprises a first 101 and a second 102 semiconductor processing system that are connected in tandem by a local substrate cassette transport system 152. FIG. 9 is a schematic top plan view of a semiconductor processing facility accommodating the semiconductor processing assembly of FIG. 8.

The processing facility may comprise a clean room bay area 180 that is at least partially bounded by a clean room bounding wall 183; and a clean room chase area 181 that is disposed adjacent to the clean room bay area 180 and separated therefrom by the clean room bounding wall 183. Clean room classifications of the clean room bay area 180 and the clean room chase area 181 may typically be similar; in case differences in their clean room classifications exist, the cleanliness of the clean room chase area 181 may typically be somewhat less than that of the clean room bay area 180.

The semiconductor processing assembly may comprise a first semiconductor processing system 101 and a second semiconductor processing system 102. The semiconductor processing assembly may also comprise a local substrate cassette transport system 152 for transporting substrate cassettes 112 between the first and second processing systems 1, 2.

Figure 16:
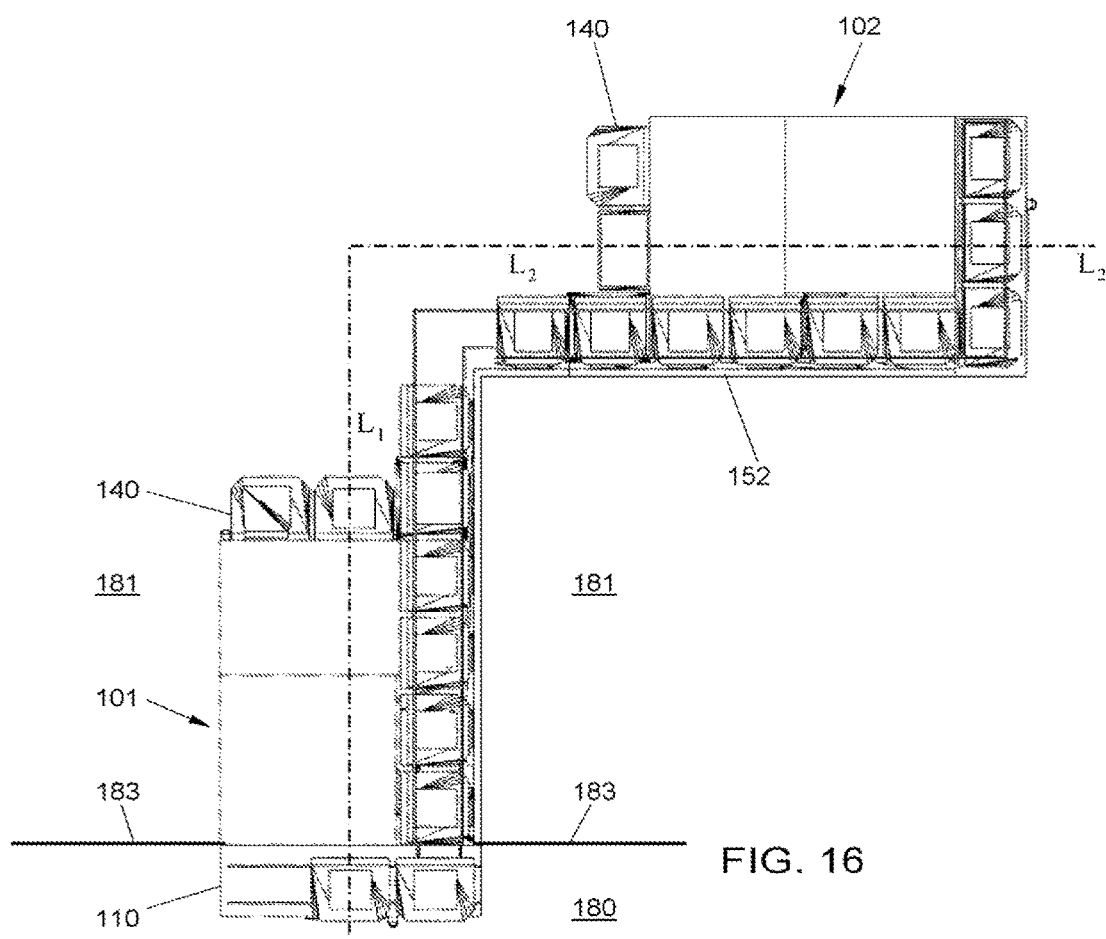
FIG. 16 is a schematic top plan view of an embodiment of a semiconductor processing facility having a right angle alignment.

Both processing systems 101, 102 may conceptually be considered to comprise a front side and a back side. The front and back sides of a respective system 101, 102 may be longitudinally oppositely disposed, and face away from one another. The first processing system 101 may be placed in contact with the clean room bounding wall 183, and extend therethrough, such that its front side is generally flush with the clean room bay area-side of the clean room bounding wall 183. The front side of the first processing system 101 may thus face the clean room bay area 180, and be accessible therefrom. The body of the first processing system 101 may be disposed substantially within the clean room chase area 181. The second processing system 102 may be disposed completely within the clean room chase area 181, and be spaced apart from the clean room bounding wall 183. It may preferably be placed 'behind' (the back side of) the first processing system 101, in a tandem configuration, such that the horizontally extending longitudinal axes of both processing systems 101, 102 extend in parallel, and preferably in alignment. It is contemplated, however, that the longitudinal axes of the systems may not extend in parallel, but at an angle, preferably a right angle, relative to each other as shown in FIG. 16. A spacing between the at least one first and at least one second semiconductor processing systems 101, 102 may typically be less than 2 meters and be bridged by the local substrate cassette transport system 152.

The semiconductor processing systems 101, 102 may be vertical batch furnaces. Accordingly, each of the semiconductor processing systems 101, 102 may, for instance, comprise a gas supply module, a processing module including a vertical furnace, a wafer handling module and a substrate cassette I/O-station module 140. The substrate cassette I/O-station 140 may include at least one load port to which a substrate cassette 112 is dockable, so as to enable an exchange of substrates between the respective semiconductor processing system 101, 102 and the docked substrate cassette 112. Such a semiconductor processing system is described in more detail with reference to FIGS. 1-7 and also in U.S. Provisional Patent Application No. 61/732,477, co-assigned herewith, and incorporated herein by reference in its entirety. —It is understood, however, that the semiconductor processing systems 101, 102, which may but need not be structurally and/or functionally identical, may in principle be of any type, including, for instance, single wafer systems, etching systems, film deposition systems, rapid thermal semiconductor processing systems, cluster systems, photo resist semiconductor processing systems, lithography systems, ion implantation systems etc.

The local substrate cassette transport system 152 may include a substrate cassette exchange station 110, e.g. in the form of a (railed) platform, for exchanging substrate cassettes 112 with a global or fab substrate cassette transport system, such as an Over-Head Transport system, of the semiconductor processing facility present in the clean room bay area 180. The substrate cassette exchange station 110 may typically be provided at the front side of the first semiconductor processing system 101, such that it is at least partially disposed within the clean room bay area 180, and accessible therefrom.

In one embodiment, such as the embodiment depicted in FIGS. 8-9, the substrate cassette exchange station 110 and the substrate cassette I/O-station 140 of the first semiconductor processing system 101 may be spaced apart, such that they are disposed at preferably longitudinally opposite sides of the semiconductor processing system 101. That is, the substrate cassette exchange station 110 may be disposed at the front of the system 101, while the substrate cassette I/O-station 140 may be disposed at the back thereof. In another embodiment, the substrate cassette exchange station 10 and the substrate cassette I/O-station 140 may be structurally and functionally integrated, and thus be disposed at a same side of the semiconductor processing system 101, e.g. at the front side.

The local substrate cassette transport system 152 may be configured to transport substrate cassettes 112 between its substrate cassette exchange station 110, and the substrate cassette I/O-stations 140 of the semiconductor processing systems 101, 102. In embodiments wherein the semiconductor processing assembly further comprise a substrate cassette stocker (to be discussed infra), the local substrate cassette transport system 152 may be configured to additionally transport substrate cassettes to and from the at least one stocker position 154, 156 of the substrate cassette stocker. To these ends the local substrate cassette transport system 152 may include a rail system which in itself may be of a conventional design. The rail system may include one or more rails, associated drivable substrate cassette carriages for transporting substrate cassettes 112 along the rails, hoist provisions and/or other features as may be needed.

The local substrate cassette transport system 152 may include a rail system including at least one typically substantially horizontally extending main rail along which a substrate cassette 112 may be transported, typically by means of a drivable substrate cassette carriage. The at least one main rail may extend between the first and second semiconductor processing systems 101, 102, and typically in a longitudinal direction of the semiconductor processing system 101, e.g. from the cassette exchange station 10 at its front side, along the substrate cassette I/O-station 140 at its back, across the gap between the first and second semiconductor processing systems 101, 102, to the substrate cassette I/O-station of the second semiconductor processing system 102. Where desired, the local substrate cassette transport system 152 may further include one or more auxiliary or sub-transport systems configured to transport substrate cassettes 112 laterally along a laterally extending auxiliary rail, e.g. from/to one of the load ports of the I/O-station 140, and/or one or more sub-transport systems configured to transport cassettes along a vertically extending auxiliary rail in a vertical direction.

Adjacent to the local substrate cassette transport system 152, a substrate cassette stocker defining at least one stocker position or substrate cassette accommodation 154 for storing a substrate cassette 112 may be provided. At least one stocker position may preferably be disposed within a combined footprint of the at least one first and at least one second semiconductor processing systems 101, 102. In a preferred embodiment, the substrate cassette stocker may provide for a plurality of stocker positions, e.g. two, three or more stocker positions. The plurality of stocker positions may be disposed along the rails of the local cassette transport system 152, and be juxtaposed/arranged in one or more substantially horizontally extending rows, for instance, in parallel with the main rail of the local substrate cassette transport system 152.

For example, the main rail of the local transport system 152, extending between the first and second semiconductor processing systems, may be provided at a first upper level. At a second, lower level a first row of stocker positions 154 may be provided to store substrate cassettes 112. The vertical distance between the first and the second level may be more than the substrate cassette height. At a third level, below the second level, a second row of stocker positions 156 may be provided. The vertical distance between the second and the third level may be more than the substrate cassette height.

The positions on the third level may be accessible only when the overhead position 154 at the second level is empty. In such a case, the substrate cassette accommodations on the second level may be made moveable, e.g. moveable to the right side so that when all positions on the second level are loaded with cassettes, and a third level position 156 needs to be accessed for loading/unloading, the substrate cassette above this position and all cassettes to the right side of it at the second level may be moved to the right so that the right most cassette is temporarily positioned above I/O-station 140 and no cassette is positioned above the third level position 154 to be accessed. After accessing the substrate cassette at the third level, the cassettes at the second level stocker may be returned to their original positions.

Figure 10:
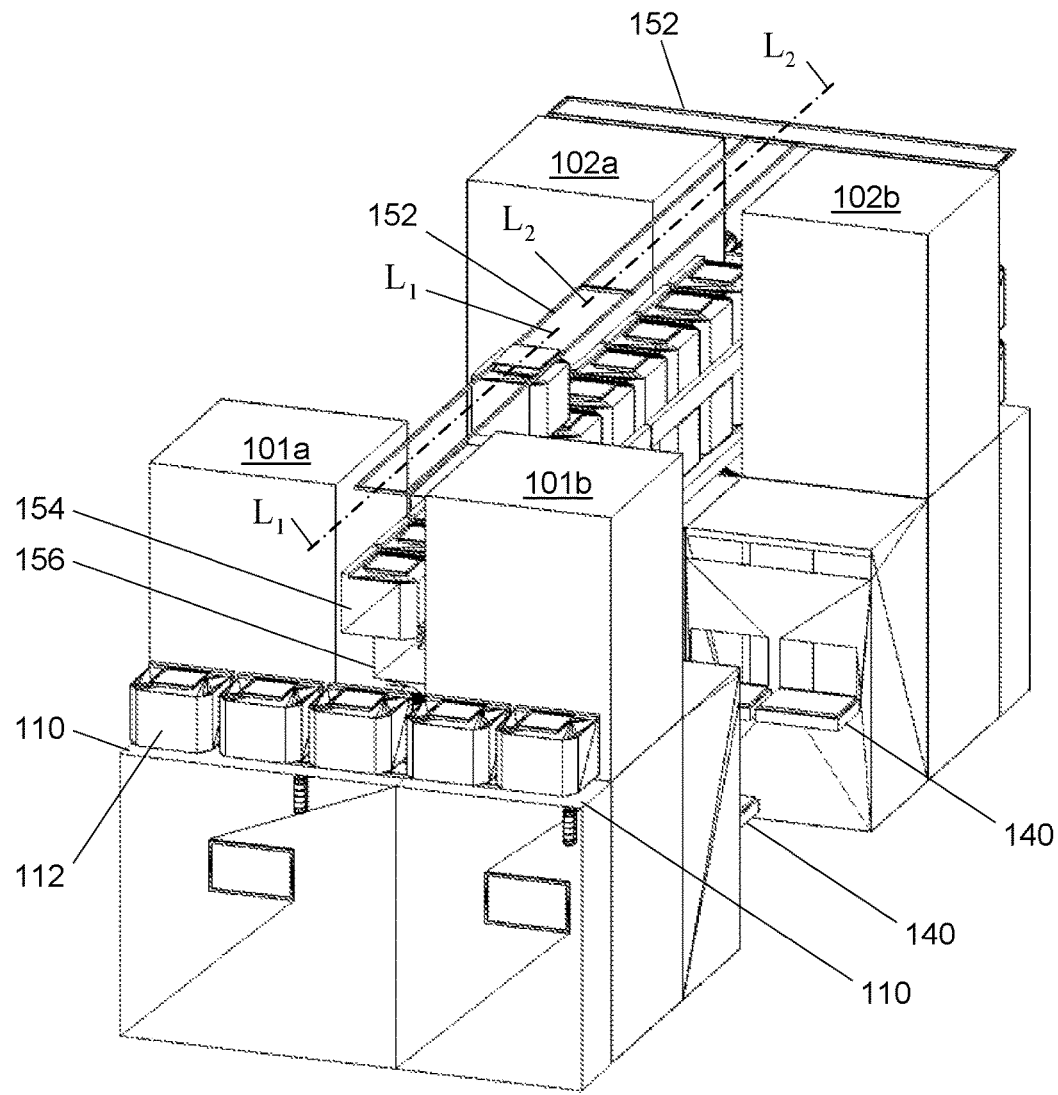
FIG. 10 schematically illustrates, in a perspective view, a sixth example of a semiconductor processing assembly comprising two juxtaposed first semiconductor processing systems, and two juxtaposed second semiconductor processing systems, wherein the first and second systems are connected in tandem by a local substrate cassette transport system.
Figure 11:
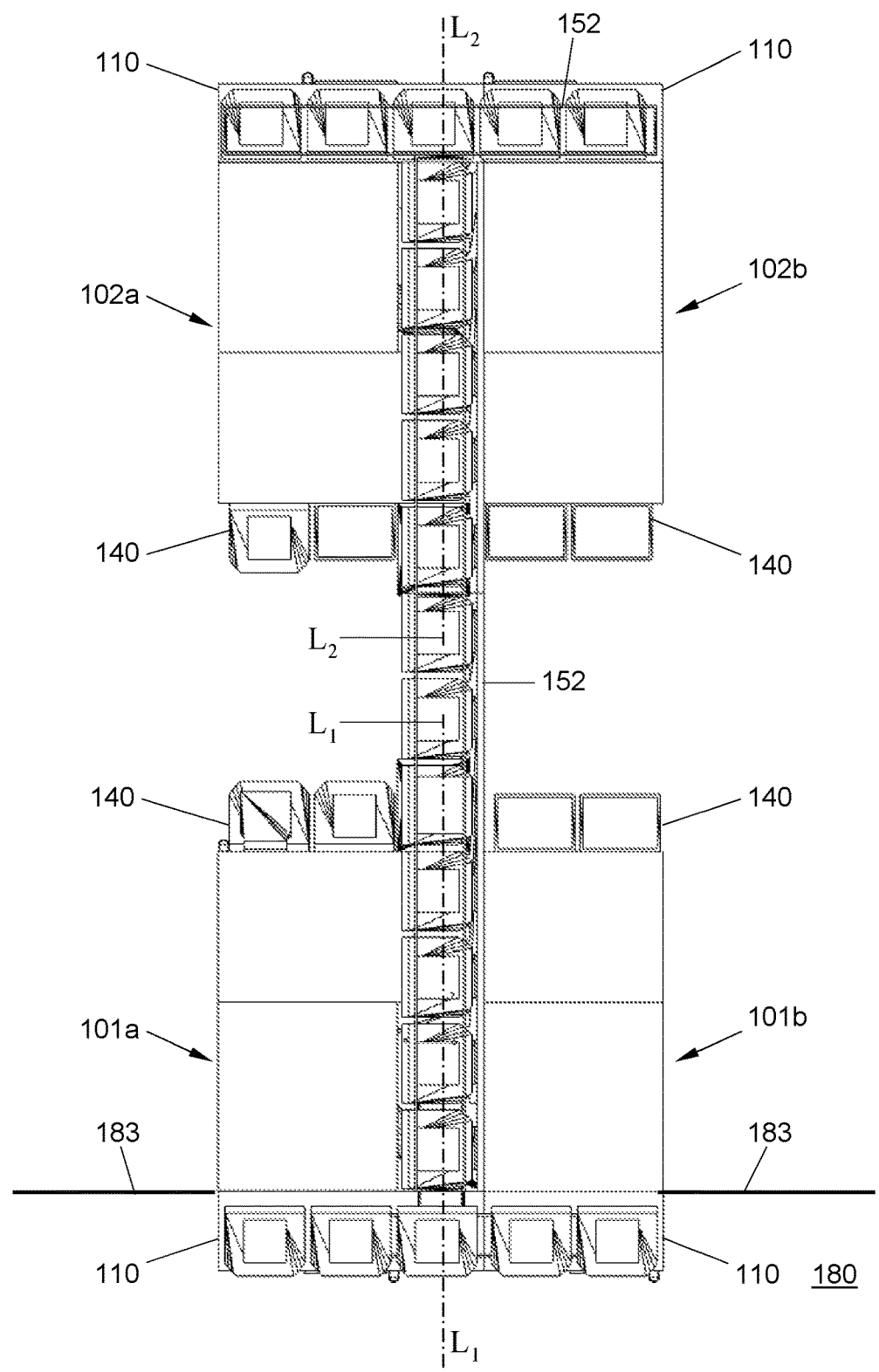
FIG. 11 is a schematic top plan view of a second embodiment of a semiconductor processing facility accommodating the semiconductor processing assembly of FIG. 10.

FIG. 10 schematically illustrates, in a perspective view, another exemplary embodiment of a semiconductor processing assembly. This exemplary embodiment comprises two juxtaposed first semiconductor processing systems 101*a*, 101*b*, and two juxtaposed second semiconductor processing systems 102*a*, 102*b*, wherein the first and second systems are operably connected in tandem by a local substrate cassette transport system 152. FIG. 11 is a schematic top plan view of a semiconductor processing facility accommodating the semiconductor processing assembly of FIG. 10. The (bodies of the) juxtaposed first processing systems 1*a*, 1*b* are disposed in contact with the clean room bounding wall 183, such that their front sides are generally flush with the clean room bay area-side of the clean room bounding wall 183, and face the clean room bay area 180 while being accessible therefrom. The juxtaposed second processing systems 102*a*, 102*b* are placed completely in the clean room chase area 181 and are spaced apart from the clean room bounding wall 183. The front sides of the first processing systems 101*a*, 101*b* may be fitted with substrate cassette exchange stations 110 of a local substrate cassette transport system 152. This local substrate cassette transport system may be configured to transport substrate cassettes between the substrate cassette exchange station 110, the substrate cassette I/O-stations 140 of the semiconductor processing systems 101*a-b*, 102*a-b*, and the stocker positions 154, 156 of the shared substrate cassette stocker. A main rail of the local substrate cassette transport system 152, which operably bridges the gap between the first and second processing systems 101*a-b* and 102*a-b*, may be arranged such that both the first and second processing systems 101*a*, 101*b* and 102*a*, 102*b*, respectively, are generally positioned symmetrically at opposite sides of the main rail.

Figure 12:
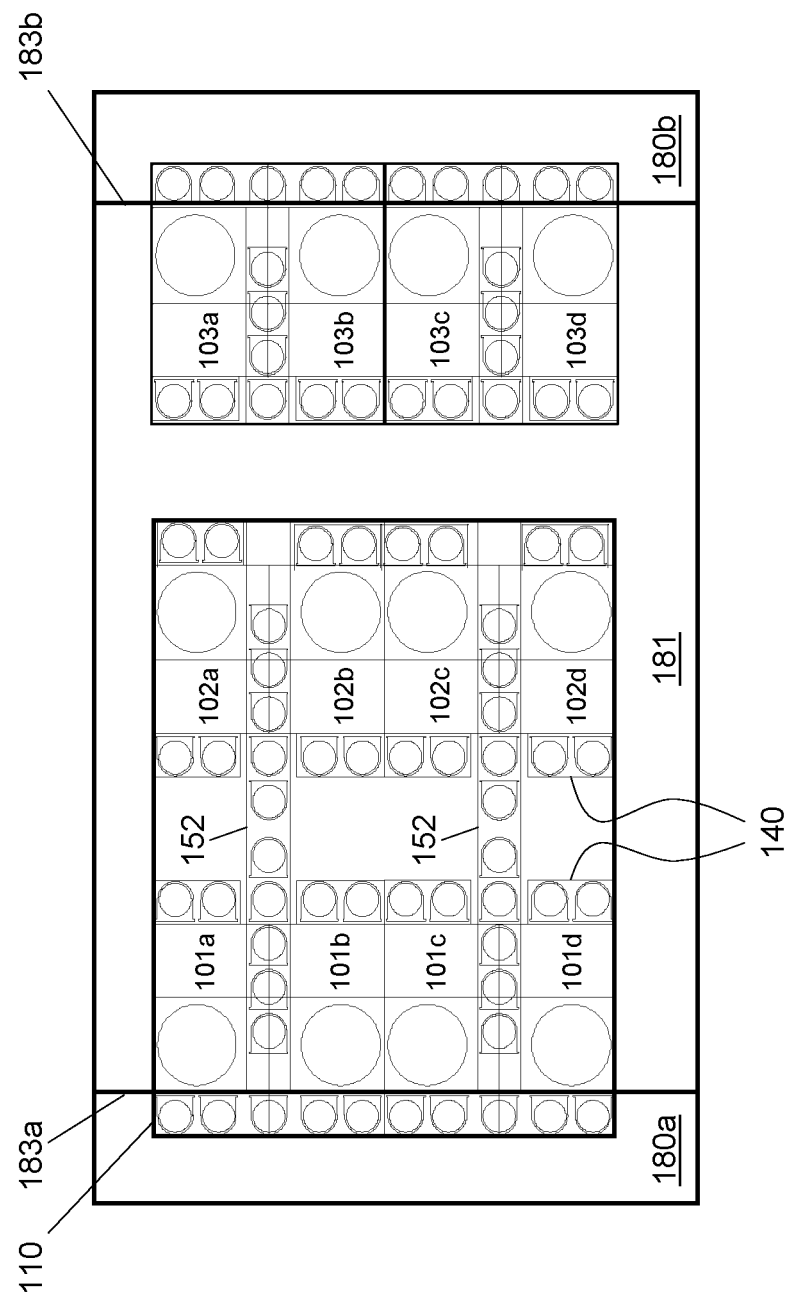
FIG. 12 schematically illustrates an exemplary floor lay-out of an embodiment of a semiconductor processing facility accommodating, on the left, two juxtaposed semiconductor processing assemblies as shown in FIG. 10, and, on the right, two semiconductor processing assemblies each of which comprises two first semiconductor processing systems.

FIG. 12 schematically illustrates an exemplary floor layout of a semiconductor processing facility accommodating, on the left, two juxtaposed semiconductor processing assemblies as shown in FIG. 10. FIG. 12 shows on the right two semiconductor processing assemblies each comprising two first semiconductor processing systems 103*a*, 103*b* and 103*c*, 103*d* respectively.

It is understood that the semiconductor processing assemblies shown on the right do not include any second semiconductor processing systems. The front sides of their first semiconductor processing systems 103*a-d* are disposed generally flush with a clean room wall 183*b*, such that they are accessible from a clean room bay area 180*b*. Since the bodies of these first processing systems 103*a-d* are of a relatively small length/depth, much of the clean room chase area 181 behind them would remain unused if similar semiconductor processing assemblies would be used on another clean room bounding wall 183*a* opposite the clean room bounding wall 183*b*.

To prevent such waste of precious clean room chase area 181, two semiconductor processing assemblies of the type shown in FIG. 10 are installed on the clean room bounding wall 183*a*. The first semiconductor processing systems 101*a*, 101*b* and 101*c*, 101*d*, respectively, of these assemblies may be placed generally flush with the clean room wall 183*a*, such that their associated substrate cassette exchange stations 110 interface with the clean room bay area 180*a*. The second processing systems 102*a*, 102*b*, and 102*c*, 102*d*, respectively, are placed entirely within the clean room chase area 181, spaced apart from the clean room bounding walls 183*a*, 183*b*. The assemblies are both provided with a local substrate cassette transport system 152 to transport substrate cassettes 112 between the substrate cassettes exchange stations 110 provided at the front sides of their first semiconductor processing systems 101*a*, 101*b* and 101*c*, 101*d*, respectively, the at least one stocker position of their respective substrate cassette stockers, and the substrate cassette I/O-stations 140 of both first and second semiconductor processing systems 101*a-d*, 102*a-d*.

Accordingly, the central region of the chase area 181 may be utilized and the present invention provides a great flexibility in the efficient utilization of clean room chase area.

Although in FIG. 12, the assemblies of FIG. 10 are placed side by side, it will be clear that also the systems of FIGS. 8 and 9 can be placed side by side. Furthermore, there might be good reasons to place systems not side by side but with some space in between, e.g. to allow access for maintenance.

Figure 13:
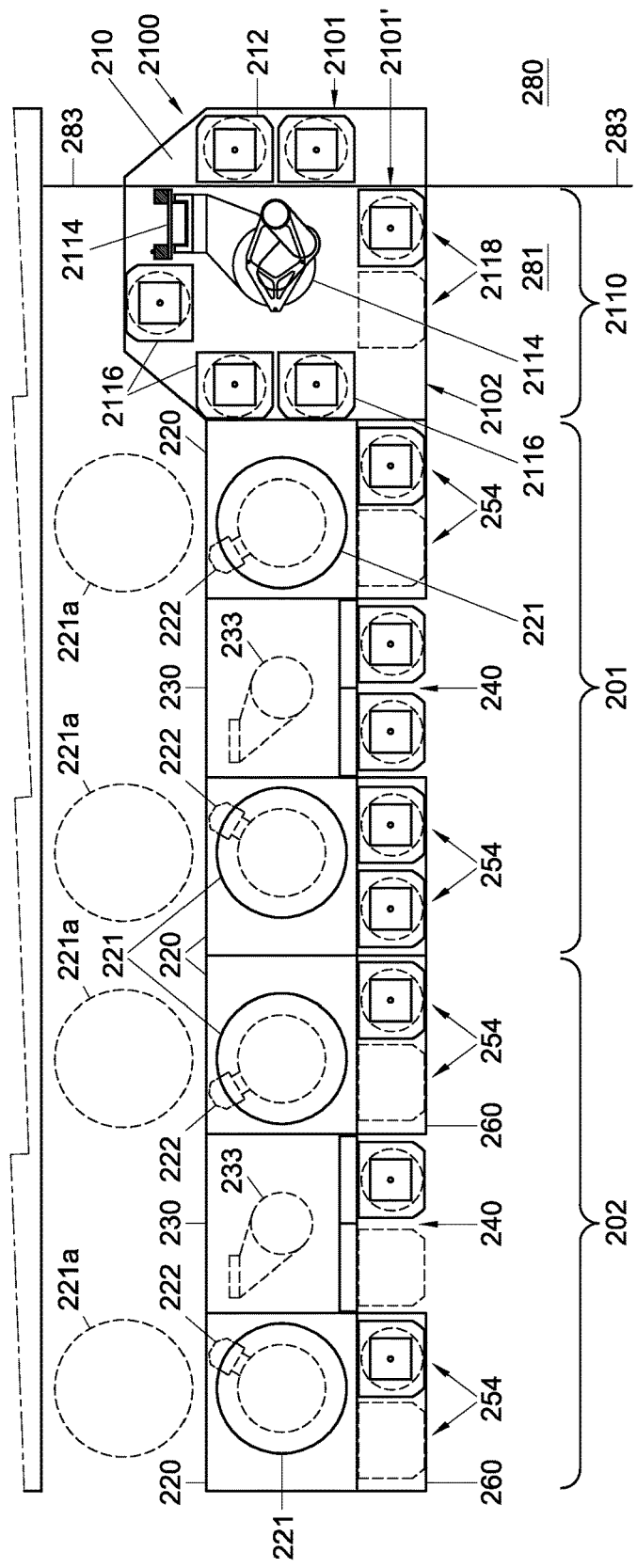
FIG. 13 schematically illustrates a top plan view of a semiconductor processing facility accommodating a semiconductor processing assembly.
Figure 14:
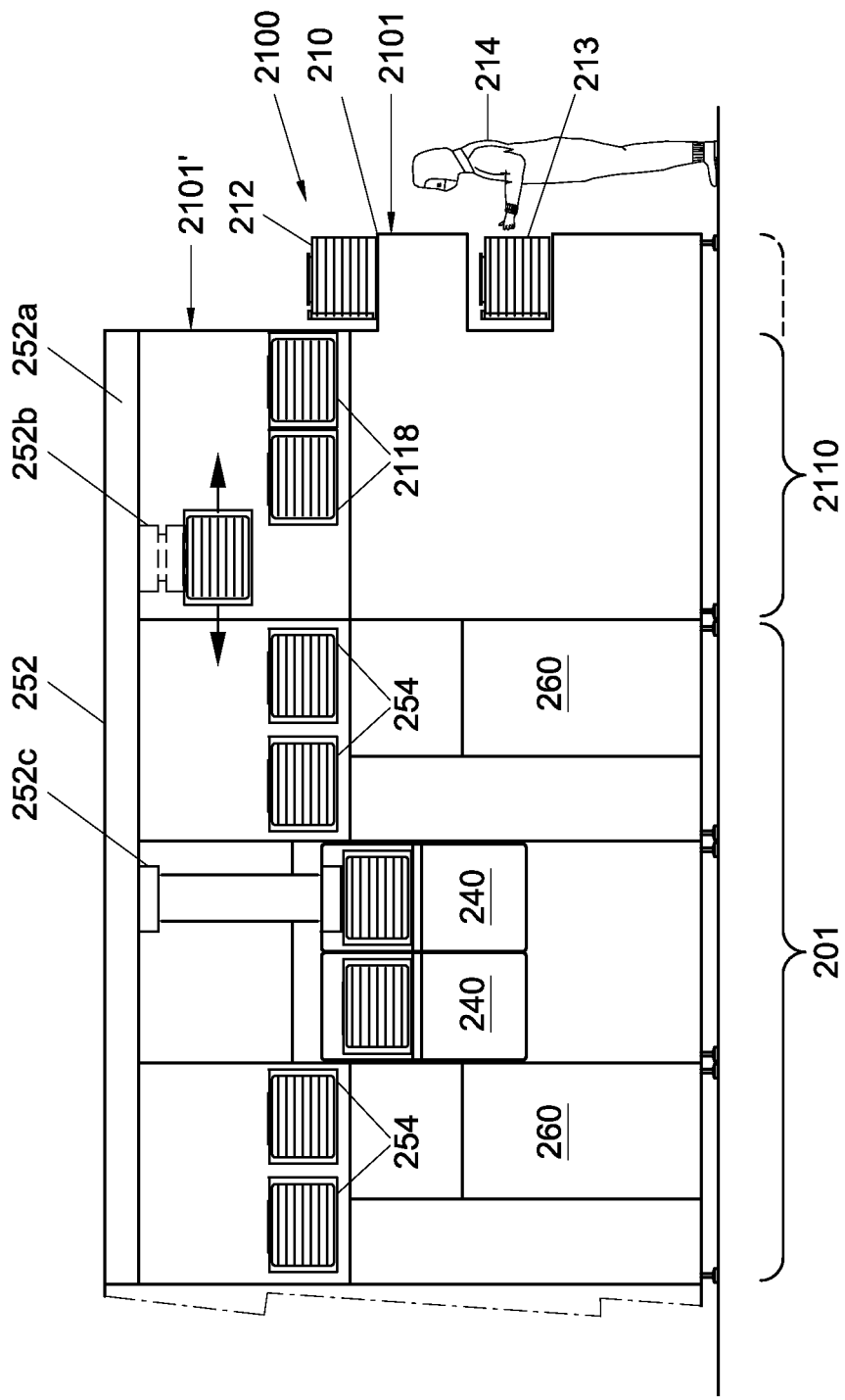
FIG. 14 schematically illustrates the semiconductor processing assembly of FIG. 13 in a side view.
Figure 15:
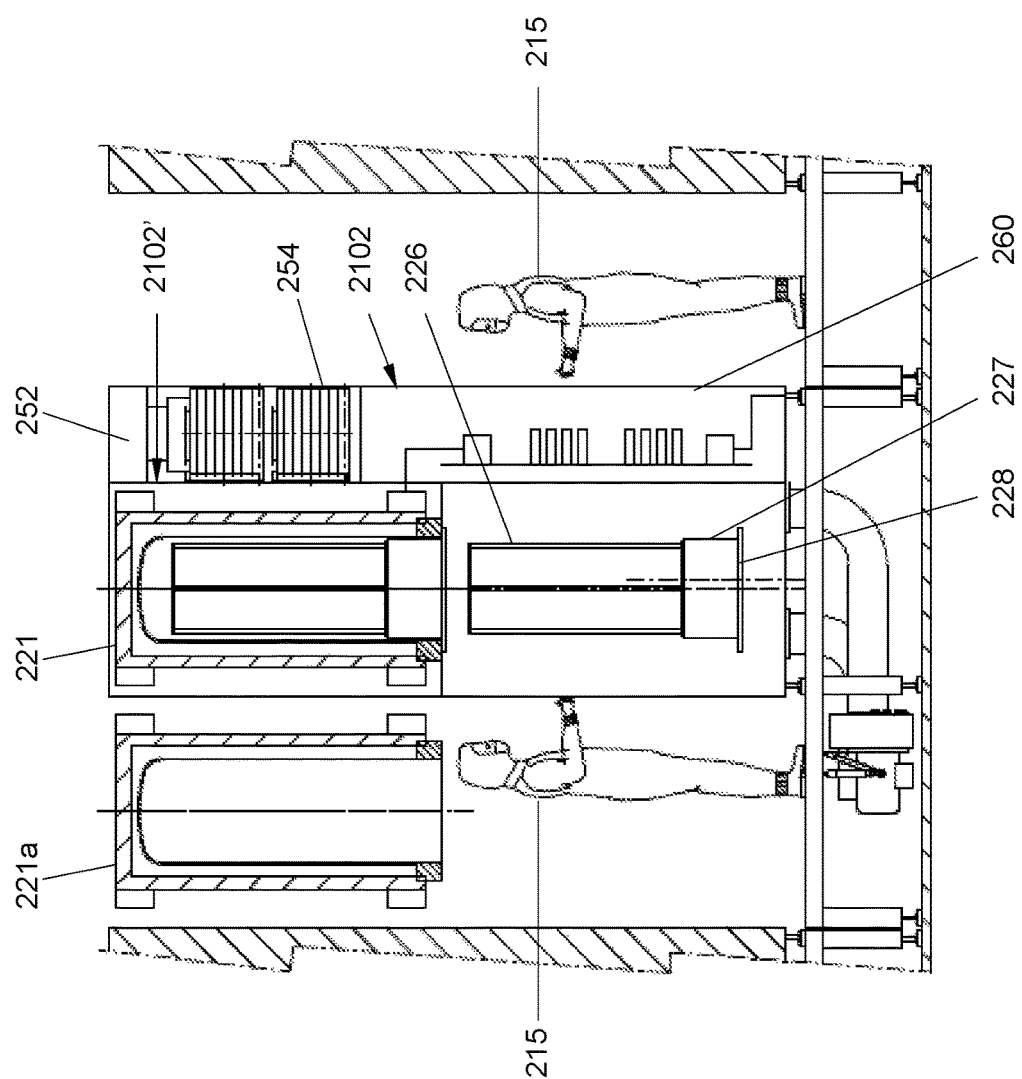
FIG. 15 schematically illustrates the semiconductor processing assembly of FIG. 13 in a cross-sectional side view.

FIGS. 13, 14 and 15 relate to a semiconductor processing assembly and a semiconductor processing facility and is presented here as background.

A clean room bay area 280 is at least partially bounded by a clean room bounding wall 283. A clean room chase area 281 is disposed adjacent to the clean room bay area 280 and separated therefrom by the clean room bounding wall 283. A semiconductor processing assembly 2100 is disposed in the clean room chase area 281 and extending through the clean room bounding wall 283 such that its front 2101, 2101' is generally flush therewith and accessible from the clean room bay area 280. Typically, an upper part of the front is flush with the clean room bounding wall and a lower part of the front extends into the clean room bay area over a depth of the depth of a substrate cassette. The semiconductor processing assembly has a side 2102, 2102', the side extending generally perpendicular to the front. The assembly comprises a local substrate cassette distribution system, comprising a substrate cassette exchange station 210 disposed at the front 2101, 2101' for exchanging substrate cassettes 212 with a global substrate cassette transport system, not shown, of a processing facility. The substrate cassettes 212 may typically comprise a door which is closed during transport to protect the substrates inside against contamination. The local substrate cassette distribution system further comprises a linear extending transport system 252 extending along the side 2102, 2102'. The assembly further comprises at least a first processing system 201. The processing system comprises at least one substrate processing module 220, a substrate transfer module 230 comprising a substrate handling robot 233, and a substrate cassette I/O module 240 including at least one load port including a door opener, to which a substrate cassette 212 is dockable and configured to open or remove the door of/from the substrate cassettes 212 docked to the load port, so as to bring the substrate cassette into communication with the substrate handling robot 233 and enable an exchange of substrates between the at least one substrate processing module and a substrate cassette docked to the load port by the substrate handling robot 233. The I/O-station 240 is disposed at the side 2102, 2102' of the assembly. The substrate cassette distribution system, including the linear substrate cassette transport system 252, is configured to transport substrate cassettes between its substrate cassette exchange station 210 and the substrate cassette I/O-station 240 of the first processing system. To that end, the linear substrate cassette transport system 252 extends from a position at or close to the substrate cassette exchange station 210 to the I/O-station 240 of the first processing system 201 and is capable of exchanging substrate cassettes with the I/O-station 240. The local substrate cassette distribution system may optionally comprise a manual substrate cassette exchange station 213 from/to which an operator 214 may manually exchange substrate cassettes. An additional transfer mechanism may be used to transfer substrate cassettes between the substrate cassette exchange station 210 and the manual substrate cassette exchange station 213, if present, and at least one hand-off position 2118 capable of exchanging substrate cassettes 212 with the linear transport system 252. The linear substrate cassette transfer system 252 in itself may be a rail system of a conventional design. The rail system may include one or more rails 252a, an associated drivable substrate cassette carriage 252b, 252c for transporting substrate cassettes 212 along the rails, hoist provisions and/or other features as may be needed. Although carriages 252b, 252c are shown in two positions, it will be understood that typically only one carriage is present. Preferably, the linear substrate cassette transport system 252 is disposed outside a housing of the semiconductor processing assembly 2100. This allows easy extension of the processing assembly with additional processing systems and the corresponding extension of the linear substrate cassette transport system 252.

The first processing system 201 may comprise a second substrate processing module 220, wherein the first and second substrate processing modules may be disposed at opposing sides of the substrate transfer 230 module and the substrate transfer robot 233 being capable of transferring substrates between the first and second process modules 220 and a substrate cassette docked to the load port.

The assembly 100 may comprise a second processing system 202 disposed next to the first processing system. The second processing system 202 may comprise at least one process module 220, a substrate transfer module 230 and an I/O-station 240 similar to the first processing system. The I/O-station 240 of the second processing system is disposed at the side 2102, 2102' of the assembly. The substrate cassette distribution system, including the linear substrate cassette transport system 252, is configured to transport substrate cassettes between its substrate cassette exchange station 210 and the substrate cassette I/O-station 240 of the first and second processing systems. To that end the linear substrate cassette transport system 252 is extending at least to the I/O-station of the second processing system and capable of exchanging substrate cassettes therewith.

For an efficient usage of floor space, the first and second processing systems 201, 202 may be placed side by side, in contact. Alternatively, if e.g. maintenance does so require, the first and second processing systems 201, 202 may be placed next to each other with some intermediate space in between. In the example of FIGS. 13 and 14, the assembly 2100 comprises 2 processing systems and each processing system comprises 2 substrate processing modules, the 2 substrate processing modules disposed at opposing sides of a substrate transfer module 230. It may be clear that, depending on the size of a substrate processing module, more than 2 substrate processing modules may be placed in substrate communication with a substrate transfer module. Alternatively, each processing system may comprise one substrate processing module 220.

The semiconductor processing assembly may comprise a stocker module 2110, comprising a plurality of storage positions 2116 for substrate cassettes 212. The stocker module may be disposed adjacent to the front 2101, 2101' of the semiconductor processing assembly 2100. The stocker module 2110 comprises a substrate cassette handler 2114 for transferring substrate cassettes 212 between the substrate cassette exchange station 210 and any of the storage position 2116. The stocker module 2110 may further comprise one or more hand-off positions 2118 from/to which the linear substrate cassette transport system 252 is capable of exchanging substrate cassettes 212. The substrate cassette handler is further configured to transfer substrate cassettes 212 to and from the hand-off positions 2118. In case of batch processing, such as in a vertical furnace wherein a batch of e.g. 100 substrates may be processed simultaneously, it is convenient if the stocker module 2110 can receive all the substrate cassettes for an entire batch. A substrate cassette typically accommodates 25 substrates and, consequently, a batch of 100 substrates requires 4 substrate cassettes. In an embodiment the stocker may comprise 16 or more storage positions 2116, preferably 32 or more storage positions 2116. With 32 storage locations, 8 batches of 100 substrates can be stored. For an assembly having 4 substrate processing modules 220 this means that for each module a batch under processing and the next batch to be processed can be stored. This allows an uninterrupted supply of substrates and maximum throughput. Optionally, along the path of the linear substrate cassette transport system, additional storage positions 254 may be provided at a different vertical level than the transport level.

The process module 220 may comprise a vertical furnace 221 in an upper region thereof and a boat 226 for accommodating a plurality of substrates in a vertically stacked arrangement, the boat being supported on a pedestal 227 and a door plate 228. During substrate transfer, the boat is in a lower region of the furnace module 220. After completion of loading of the substrates into the boat 26, the boat is moved upward into the vertical furnace by boat elevator 222 for processing. After completion of the processing, the boat is moved downward out of the vertical furnace and the substrates are unloaded from the vertical furnace. For maintenance purposes, a vertical furnace 221 may be moved out of the substrate processing module into a maintenance position 221a as shown in FIGS. 13 & 15. The process module may further comprise a cabinet 260 containing gas control components, vacuum components and a system controller.

Although in the Figures an example of a vertical furnace is shown, it is understood, however, that the process modules 220 do not need to be vertical furnaces and the substrate processing modules 220 of a semiconductor processing assembly do not need to be identical. Each module 220 of a semiconductor processing assembly may be independently selected from the group of for instance, vertical furnaces, single substrate systems, etching systems, film deposition systems, rapid thermal processing systems, multi station systems, photo resist semiconductor processing systems, lithography systems, ion implantation systems etc. A substrate processing module may be a metrology system for measuring a property of the substrate or a film on the substrate, like resistivity, film thickness, the presence of particles etc. In this manner, it is possible to perform two or more processing steps sequentially, with metrology steps in between, without a need for removing the substrate cassettes with substrates from the semiconductor processing assembly through the global substrate cassette transport system of the semiconductor processing facility. This greatly simplifies the facility logistics.

It will also be clear that the present invention is not limited to semiconductor processing assemblies including only first and second systems placed in tandem. In some embodiments, for instance, a semiconductor processing assembly may additionally comprise at least one third semiconductor processing system, whose relationship to the second semiconductor processing system may essentially be the same as the at least one second semiconductor processing system's relation to the at least one first semiconductor processing system. That is, the at least one first, second and third semiconductor processing systems of the assembly may all be arranged in a tandem configuration, wherein the second system is disposed behind the first, and the third system is disposed behind the second, and wherein substrate cassettes are transportable between the at least one first, second and third systems by the local substrate cassette transport system.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims. Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, it is noted that particular features, structures, or characteristics of one or more embodiments may be combined in any suitable manner to form new, not explicitly described embodiments.

LIST OF ELEMENTS

1, 1a, 1b semiconductor processing system, e.g. vertical furnace
10 substrate cassette exchange station
12 substrate cassette
20 processing module
20a housing
21 vertical furnace
22 boat elevator
26 wafer boat
27 pedestal
28 door plate
30 wafer handling module
30a housing
33 wafer handling robot
34 axis
35 multi axis arm
40 substrate cassette I/O-station module
52 local substrate cassette transport system
54 stocker position/substrate cassette accommodation
56 further stocker positions
58 cassette hand-off position
60 gas supply module
70 mini-environment
80, 80a, 80b clean room
81 clean room service area/chase area
83, 83a, 83b clean room wall
701, 702 complex of semiconductor processing assemblies
101, 101a, 101b, 101c, 101d first processing system
102, 102a, 102b, 102c, 102d second processing system
103a, 103b, 103c, 103d processing system
110 substrate cassette exchange station, e.g. a platform
112 substrate cassette
140 substrate cassette I/O-station module with door openers
152 local substrate cassette transport system
154 stocker positions
156 further stocker positions
180, 180a, 180b clean room bay area
181 clean room chase area/service area
183, 183a, 183b clean room bounding wall
$L_{1,2}$ longitudinal axes ($L_1$) of the at least one first and ($L_2$) of the at least one second semiconductor processing system
201 first processing system
202 second processing system
210 substrate cassette exchange station
212 substrate cassette
213 manual substrate cassette exchange station 214 operator
215 service engineer
220 substrate processing module
221 vertical furnace
221a vertical furnace in maintenance position
222 boat elevator
226 substrate boat
227 pedestal
228 door plate
230 substrate transfer module
233 substrate handling robot
240 substrate cassette I/O-station
252 linear substrate cassette transport system
252a transport rail
252b, c substrate cassette carriage
254 substrate cassette storage position
260 cabinet
280 clean room bay area
281 clean room chase area/service area
283 clean room bounding wall
2100 semiconductor processing assembly
2101, 2101' front of semiconductor processing assembly
2102, 2102' longitudinal side of semiconductor processing assembly
2110 stocker module
2114 substrate cassette handler
2116 storage location
2118 hand-off position

The invention claimed is:

1. A semiconductor processing facility, comprising:
a clean room bay area, at least partially bounded by a clean room bounding wall;
a clean room chase area, disposed adjacent to the clean room and separated therefrom by the clean room bounding wall; and
a semiconductor processing assembly, including:
at least one first semiconductor processing system comprising a rectangular outer housing having a front wall, a back wall, and two side walls which together define a rectangular footprint of the first semiconductor processing system, wherein the front wall defines a front side of the system, said system extending through the clean room bounding wall, such that its front side is flush therewith and accessible from the clean room bay area;
at least one second semiconductor processing system comprising a rectangular outer housing having a front wall, a back wall, and two side walls which together define a rectangular footprint of the second semiconductor processing system, wherein the front wall defines a front side of the system, the at least one second semiconductor processing system being disposed completely within the clean room chase area and spaced apart from the clean room bounding wall; and
a local substrate cassette transport system, configured to transport substrate cassettes between the at least one first and at least one second semiconductor processing systems and including:
a substrate cassette exchange station for exchanging substrate cassettes with a global cassette transport system of a processing facility, wherein the substrate cassette exchange station is provided at the front side of the at least one first semiconductor processing system, and accessible from the clean room bay area, and
wherein said local substrate cassette transport system is configured to transport substrate cassettes between its substrate cassette exchange station and the at least one first and at least one second semiconductor processing systems and wherein the local substrate cassette transport system includes a rail system, including at least one substantially horizontally extending main rail along which a substrate cassette is transportable, wherein said at least one main rail extends between and at least partly vertically above and over the at least one first and at least one second semiconductor processing systems.

2. The semiconductor processing facility according to claim 1, wherein the at least one first and at least one second processing systems are both associated with a respective, horizontally extending longitudinal axis that extends parallel to a floor of the semiconductor processing facility and to the two side walls of the first processing system and second processing system respectively, and
wherein the at least one first and at least one second semiconductor processing systems are arranged such that their respective longitudinal axes extend in parallel.

3. The semiconductor processing facility according to claim 2, wherein the longitudinal axis associated with the at least one first semiconductor processing system extends substantially perpendicular to the clean room bounding wall.

4. The semiconductor processing facility according to claim 1, wherein the at least one first and at least one second processing systems are both associated with a respective, horizontally extending longitudinal axis that extends parallel to a floor of the semiconductor processing facility and to the two side walls of the first processing system and the second processing system respectively, and
wherein the at least one first and at least one second semiconductor processing systems are arranged such that their respective longitudinal axes are at an angle relative to each other.

5. The semiconductor processing facility according to claim 4, wherein the longitudinal axis associated with the at least one first semiconductor processing system extends substantially perpendicular to the clean room bounding wall.

6. The semiconductor processing facility according to claim 1, wherein the at least one first semiconductor processing system includes a plurality of juxtaposed first semiconductor processing systems.

7. The semiconductor processing facility according to claim 1, wherein the at least one second semiconductor processing system includes a plurality of juxtaposed second semiconductor processing systems.

8. The semiconductor processing facility according to claim 1, wherein a gap between the at least one first and the at least one second semiconductor processing systems is less than 2 meters.

9. The semiconductor processing facility according to claim 1, wherein each of the at least one first semiconductor processing system and the at least one second semiconductor processing system includes:
a substrate cassette I/O-station including at least one load port to which a substrate cassette is dockable, so as to enable an exchange of substrates between the respective semiconductor processing system and the substrate cassette, and
wherein the local substrate cassette transport system is configured to transport substrate cassettes between the substrate cassette exchange station, and the substrate cassette I/O-stations of the first and second semiconductor processing systems.

10. The semiconductor processing facility according to claim 9, wherein the substrate cassette exchange station and the substrate cassette I/O-station on the at least one first semiconductor processing system are spaced apart, such that they are disposed at longitudinally opposite sides of the at least one first semiconductor processing system.

11. The semiconductor processing facility according to claim 9, wherein the substrate cassette exchange station and the substrate cassette I/O-station on the at least one first semiconductor processing system are structurally integrated, such that they are disposed at a same side of the at least one first semiconductor processing system.

12. The semiconductor processing facility according to claim 1, wherein the semiconductor processing assembly includes a substrate cassette stocker that provides for at least one stocker position configured to temporarily store a substrate cassette, wherein the at least one stocker position is at least partially disposed within a combined footprint of the at least one first and the at least one second semiconductor processing systems, and
wherein the local substrate cassette transport system is additionally configured to transport substrate cassettes to and from the at least one stocker position of the substrate cassette stocker.

13. The semiconductor processing facility according to claim 12, wherein the substrate cassette stocker provides for a plurality of stocker positions, each configured to temporarily store a substrate cassette.

14. The semiconductor processing facility according to claim 13, wherein the plurality of stocker positions are arranged in at least one substantially horizontally extending row that includes a plurality of juxtaposed stocker positions.

15. The semiconductor processing facility according to claim 1, wherein the at least one first semiconductor processing system or the at least one second semiconductor processing system comprises a vertical furnace.

16. The semiconductor processing facility according to claim 15, wherein the at least one semiconductor processing system comprising a vertical furnace comprises the following modules:
   a processing module including the vertical furnace;
   a substrate cassette I/O-station including at least one load port to which a substrate cassette is dockable, so as to enable an exchange of substrates between the respective semiconductor processing system and the substrate cassette,
   a wafer handling module configured to transfer semiconductor substrates between the processing module and a substrate cassette docked to the load port of the I/O-station module; and
   a gas supply module including at least one gas supply or gas supply connection for providing the vertical furnace of the processing module with process gas.

17. The semiconductor processing facility according to claim 16, wherein at least two of the modules of the at least one semiconductor processing system comprising a vertical furnace are mutually decouplably coupled, such that said at least two modules are decouplable from one another to facilitate servicing of the system, and in particular the vertical furnace thereof.

* * * * *